(12) United States Patent
Xi et al.

(10) Patent No.: US 10,418,522 B2
(45) Date of Patent: Sep. 17, 2019

(54) OPTOELECTRONIC DEVICE AND METHOD FOR MAKING THE SAME

(71) Applicant: GOFORWARD TECHNOLOGY INC., Hangzhou, Zhejiang (CN)

(72) Inventors: Yangang Xi, Forest Hills, NY (US); Jiguang Li, Zhejiang (CN)

(73) Assignee: GOFORWARD TECHNOLOGY INC., Hangzhou, Zhejiang (CN)

( * ) Notice: Subject to any disclaimer, the term of this patent is extended or adjusted under 35 U.S.C. 154(b) by 0 days.

(21) Appl. No.: 15/847,022

(22) Filed: Dec. 19, 2017

(65) Prior Publication Data

US 2018/0175244 A1 Jun. 21, 2018

Related U.S. Application Data

(60) Provisional application No. 62/436,651, filed on Dec. 20, 2016.

(51) Int. Cl.
| | | |
|---|---|---|
| *H01L 33/00* | (2010.01) | |
| *H01L 33/32* | (2010.01) | |
| *H01L 31/18* | (2006.01) | |
| *H01L 31/0304* | (2006.01) | |

(Continued)

(52) U.S. Cl.
CPC .......... *H01L 33/32* (2013.01); *H01L 21/0251* (2013.01); *H01L 21/0254* (2013.01); *H01L 21/02439* (2013.01); *H01L 21/02458* (2013.01); *H01L 21/02505* (2013.01); *H01L 31/03044* (2013.01); *H01L 31/03046* (2013.01); *H01L 31/1848* (2013.01); *H01L 31/1852* (2013.01); *H01L 31/1856* (2013.01);

(Continued)

(58) Field of Classification Search
CPC .............. H01L 33/32; H01L 31/03044; H01L 31/1852; H01L 31/1848; H01L 31/1856; H01L 33/007; H01L 33/0075; H01L 31/03046

See application file for complete search history.

(56) References Cited

U.S. PATENT DOCUMENTS

| | | |
|---|---|---|
| 6,929,867 B2 | 8/2005 | Armitage et al. |
| 7,842,939 B2 | 11/2010 | Jorgenson et al. |
| 7,915,624 B2 | 3/2011 | Jorgenson |

(Continued)

OTHER PUBLICATIONS

Seo, H.-S. et al., "Growth and physical properties of epitaxial HfN layers on MgO(001)," Journal of Applied Physics, vol. 96, No. 1, Jul. 1, 2004, pp. 878-884.

(Continued)

*Primary Examiner* — Didarul A Mazumder
*Assistant Examiner* — Wasiul Haider
(74) *Attorney, Agent, or Firm* — Hamre, Schumann, Mueller & Larson, P.C.

(57) ABSTRACT

An optoelectronic device and method of manufacturing an optoelectronic device are disclosed. The optoelectronic device includes a substrate; a semiconductor comprising an n-type layer disposed on the substrate, a p-type layer disposed on the n-type layer, and an active layer disposed between the n-type layer and the p-type layer; a transition layer disposed on the substrate and located between the n-type layer and the substrate, the transition layer including an oxygenated IIIA-transition metal nitride; and a p-contact layer disposed on the p-type layer of the semiconductor.

14 Claims, 7 Drawing Sheets

(51) Int. Cl.
  *H01L 21/02* (2006.01)
  *H01L 33/12* (2010.01)
(52) U.S. Cl.
  CPC ........ *H01L 33/007* (2013.01); *H01L 33/0075* (2013.01); *H01L 33/12* (2013.01); *Y02P 70/521* (2015.11)

(56) References Cited

U.S. PATENT DOCUMENTS

| | | | |
|---|---|---|---|
| 8,253,157 B2 | 8/2012 | Jorgenson | |
| 9,515,226 B2 | 12/2016 | Xi | |
| 2004/0079949 A1 | 4/2004 | Chiyo et al. | |
| 2005/0167693 A1 | 8/2005 | Goetz et al. | |
| 2006/0145166 A1 | 7/2006 | Akasaki et al. | |
| 2009/0184398 A1 | 7/2009 | Choi | |
| 2009/0230842 A9 | 9/2009 | Son et al. | |
| 2010/0184273 A1 | 7/2010 | Choi et al. | |
| 2010/0221885 A1* | 9/2010 | Kitano | C23C 14/0676 438/287 |
| 2011/0189838 A1 | 8/2011 | Kouvetakis et al. | |
| 2012/0001213 A1 | 1/2012 | Jorgenson | |
| 2013/0032836 A1 | 2/2013 | Chen et al. | |
| 2013/0048939 A1 | 2/2013 | Zhang et al. | |
| 2013/0048942 A1* | 2/2013 | Konno | H01L 21/0242 257/13 |
| 2013/0134388 A1* | 5/2013 | Ueda | H01L 33/04 257/13 |
| 2014/0203287 A1 | 7/2014 | Zhang et al. | |
| 2017/0040490 A1* | 2/2017 | Lee | H01L 21/02458 |
| 2018/0120495 A1* | 5/2018 | Liang | G02B 6/0056 |

OTHER PUBLICATIONS

Jayaraman, S. et al., "HfB2 and Hf-B-N hard coatings by chemical vapor deposition," Surface & Coatings Technology 200 (2006) pp. 6629-6633.

Liao, M.Y. et al., "Growth and stress evolution of hafnium nitride films sputtered from a compound target," J. Vac. Sci. Technol. A, vol. 22, No. 1, Jan./Feb. 2004, pp. 214-220.

Wang, Wenwu et al., "The Fabrication of Hafnium Nitride by Metal Organic Chemical Vapor Deposition (MOCVD) Using TDEAHf Precursor for Gate-Electrode Application," Japanese Journal of Applied Physics, vol. 43, No. 11A, 2004 pp. L1445-L1448.

Howe, B.M. et al., "Real-time control of AlN incorporation in epitaxial Hf1-xAlxN using high-flux, low-energy (10-40 eV) ion bombardment during reactive magnetron sputter deposition from a Hf0.7Al0.3 alloy target," Acta Materialia 59 (2011) pp. 421-428.

Zhang, Jianping et al., "Hafnium-doped GaN with n-type electrical resistivity in the 10-4Ωcm range," Applied Physics Letters, 99, 202113 (2011) pp. 1-3.

Howe, B. et al., "Growth and physical properties of epitaxial metastable Hf1-xAlxN alloys deposited on MgO(001) by ultrahigh vacuum reactive magnetron sputtering," Surface & Coatings Technology 202 (2007) pp. 809-814.

Wang, W.W. et al., "Effect of NH3 on the fabrication of HfN as gate-electrode using MOCVD," Thin Solid Films 498 (2006) pp. 75-79.

Kim, Younsou et al., "Metal-Organic CVD of Conductive and Crystalline Hafnium Nitride Films," Chemical Vapor Depositions, 11, 2005, pp. 294-297.

Xu, X. et al., "Epitaxial condition and polarity in GaN grown on a HfN-buffered Si(111) wafer," Applied Physics Letters, 36, 182104 (2005) pp. 1-3.

Han, J.G. et al., "Growth of Hf(C,N) thin films on Si(100) and D2 steel substrates by plasma assisted MOCVD," Surface & Coatings Technology 131 (2000) pp. 73-78.

Armitage, R. et al., "Lattice-matched HfN buffer layers for epitaxy of GaN on Si," Applied Physics Letters, vol. 81, No. 8, Aug. 19, 2002, pp. 1450-1452.

Howe, Brandon M., "Growth, Physical Properties, and Nanostructuring of Epitaxial Metastable Hafnium Aluminum Nitride," Dissertation, University of Illinois at Urbana-Champaign, 2010, 144 pages.

International Search Report and Written Opinion issued for International Application No. PCT/US2014/041064, dated Sep. 24, 2014, 9 pages.

* cited by examiner

OPTOELECTRONIC DEVICE AND METHOD FOR MAKING THE SAME

FIELD

This disclosure is directed to optoelectronic devices. More specifically, this disclosure is directed to optoelectronic devices such as light emitting diodes, photodetectors, or the like, and methods for making optoelectronic devices.

BACKGROUND

Optoelectronic devices, such as light emitting diodes (LEDs), photodetectors, etc., are semiconductor devices that generate light from electrical excitation where electrons and holes combine or can absorb light. III-Nitride based LEDs, such as gallium nitride (GaN) based LEDs, have been widely used in numerous applications due to their ability to output light having wavelengths in the ultraviolet (UV), blue, and green spectrums.

SUMMARY

This disclosure is directed to optoelectronic devices. More specifically, this disclosure is directed to optoelectronic devices such as light emitting diodes, photodetectors, or the like, and methods for making optoelectronic devices.

An optoelectronic device is disclosed. The optoelectronic device includes a substrate; a semiconductor configured to generate light and comprising an n-type layer disposed on the substrate, a p-type layer disposed on the n-type layer, and an active layer disposed between the n-type layer and the p-type layer; a transition layer disposed on the substrate and located between the n-type layer and the substrate, the transition layer can include a IIIA-transition metal nitride or oxygenated IIIA-transition metal nitride; and a p-contact layer disposed on the p-type layer of the semiconductor.

In an embodiment, the optoelectronic device includes a buffer layer. The buffer layer can be disposed between the substrate and the transition layer, according to an embodiment. In an embodiment, the buffer layer can be disposed between the transition layer and the n-type semiconductor layer. In an embodiment, the buffer layer can be disposed between the substrate and the transition layer and between the transition layer and the n-type semiconductor layer. In an embodiment, the buffer layer can be disposed between sub-layers of the transition layer. In an embodiment, sub-layers of the buffer layer and sub-layers of the transition layer can be arranged as alternating layers. In an embodiment, the buffer layer includes an oxygenated IIIA-transition metal nitride. In an embodiment, the buffer layer includes a IIIA-transition metal nitride.

A method for manufacturing an optoelectronic device is disclosed. The method includes forming a transition layer on a substrate, wherein the transition layer includes a IIIA-transition metal nitride or oxygenated IIIA-transition metal nitride; forming an n-type layer on the transition layer; forming an active layer on the n-type layer; forming a p-type layer on the active layer, so that the active layer is disposed between the n-type layer and the p-type layer; and forming a p-contact layer on the p-type layer and an n-contact layer on the transition layer or the n-type layer.

In an embodiment, the method for manufacturing the optoelectronic device further includes forming a buffer layer between the substrate and the transition layer. In an embodiment, the method for manufacturing the optoelectronic device further includes forming a buffer layer between the transition layer and the n-type layer.

BRIEF DESCRIPTION OF THE DRAWINGS

References are made to the accompanying drawings that form a part of this disclosure, and which illustrate embodiments in which the systems and methods described in this specification can be practiced.

Like reference numbers represent like parts throughout.

DETAILED DESCRIPTION

Figure 1A:
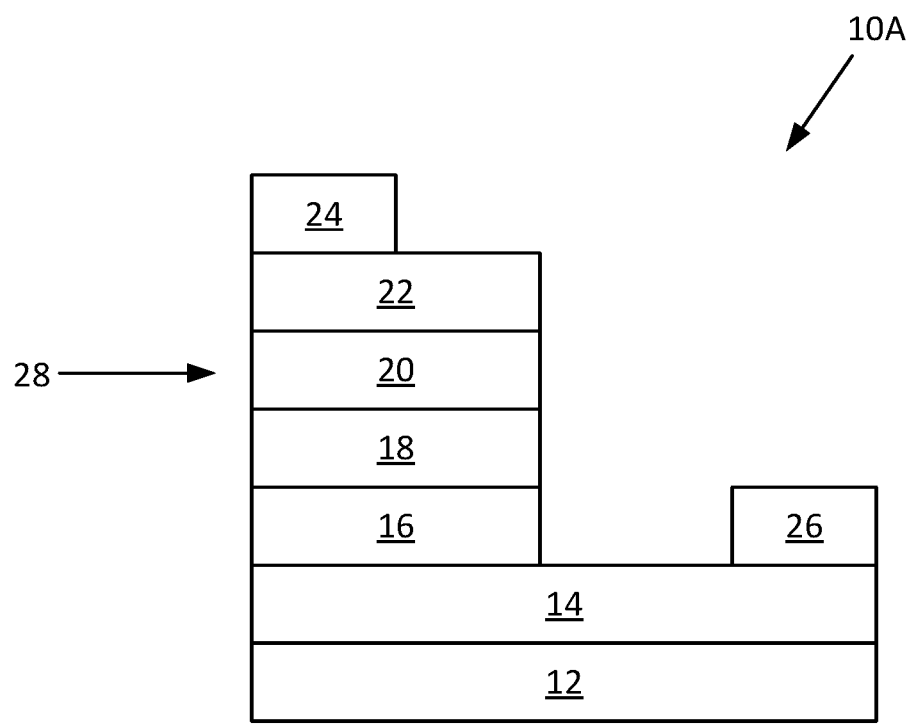
FIGS. 1A-1B illustrate schematic diagrams of optoelectronic devices including a transition layer, according to an embodiment.

When manufacturing optoelectronic devices such as, but not limited to, light emitting diodes (LEDs), photodetectors, etc., such as, but not limited to, gallium nitride (GaN) LEDs, GaN is generally deposited on a substrate made of, for example, sapphire (e.g., a flat or patterned sapphire substrate (PSS)), silicon, silicon carbide (SiC), combinations thereof, or the like. The GaN is generally deposited via a chemical vapor deposition method, such as, but not limited to, a metal organic chemical vapor deposition, or via a molecular-beam epitaxy method. However, following the deposition, the GaN layer on the substrate can crack when cooled to room temperature. Furthermore, gallium may have poor wetting on a silicon substrate surface, which can lead to manufacturing failures when forming the GaN LEDs.

Embodiments described in this specification are directed to formation of optoelectronic devices (e.g., a GaN LED, etc.) that include a transition layer or a transition layer and a buffer layer. When the optoelectronic devices include a transition layer, the transition layer can be formed of an oxygenated IIIA-transition metal nitride. Inclusion of such a transition layer can, for example, improve a quality of the GaN formed on the substrate. When the optoelectronic devices include a transition layer and a buffer layer, one or more of the transition layer and the buffer layer can be formed of an oxygenated IIIA-transition metal nitride. Inclusion of such an oxygenated buffer layer or oxygenated transition layer can, for example, improve a quality of the GaN formed on the substrate.

An oxygenated IIIA-transition metal nitride, as used in this specification, can include a composition that includes oxygen, IIIA metal, transition metal, and nitrogen. In an embodiment, an oxygenated IIIA-transition metal nitride can be formed by, for example, co-depositing IIIA metal and transition metal in nitrogen and oxygen to form oxygenated IIIA-transition metal nitride at elevated temperature. In an embodiment, a content of oxygen in the oxygenated IIIA-transition metal nitride can range from about 0.0001% to about 15%. In an embodiment, a content of oxygen in the oxygenated IIIA-transition metal nitride can range from about 0.0001% to about 5%. In an embodiment, a content of oxygen in the oxygenated IIIA-transition metal nitride can range from about 1% to about 15%.

A IIIA-transition metal nitride, as used in this specification, can include a composition that includes a IIIA metal, a transition metal, and nitrogen. In an embodiment, a IIIA-transition metal nitride can be formed by, for example, integrating a IIIA metal into a transition metal nitride or by integrating a transition metal into a IIIA metal nitride.

A buffer layer, as used in this specification, includes oxygen or does not include oxygen. The buffer layer can include oxygenated IIIA metal nitride or IIIA metal nitride. The oxygenated IIIA metal nitride can include oxygen, IIIA metal, and nitrogen. The IIIA metal nitride can include IIIA metal and nitrogen.

A layer, as used in this specification, includes a thickness of a material or composition over a surface. It will be appreciated that the term layer is not intended to indicate a particular thickness or geometry of the material or composition. The layer can include multiple sub-layers. The multiple sub-layers can arranged in a continuous manner or in an alternating manner with other sublayers or layers.

An n-type layer, as used in this specification, includes a layer having a majority of carriers which are electrons.

A p-type layer, as used in this specification, includes a layer having a majority of carriers which are holes. That is, the p-type layer generally has an absence of electrons.

An optoelectronic device, as used in this specification, includes a light emitting device (such as, but not limited to, a light emitting diode or the like) or a photodetector or photodiode.

Figure 1B:
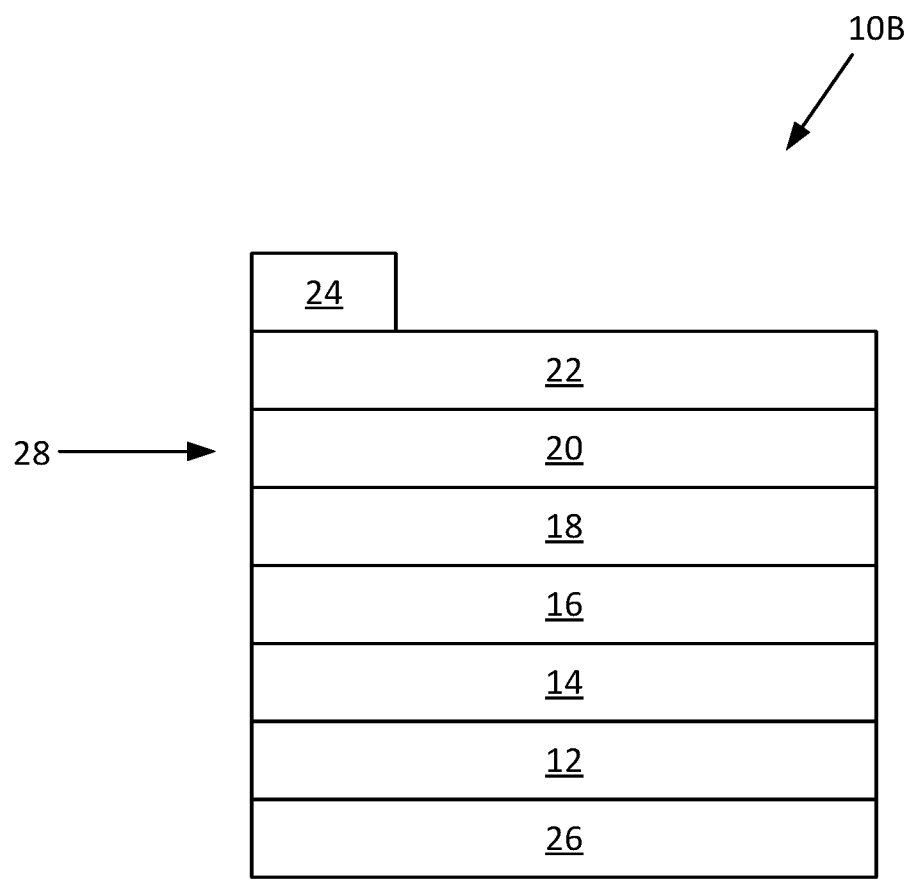

FIGS. 1A-1B illustrate schematic diagrams of optoelectronic devices 10A-10B including a transition layer 14, according to an embodiment. The optoelectronic devices 10A 10B can be representative of, for example, a light emitting diode (LED), or the like.

With reference to FIG. 1A, the optoelectronic device 10A generally includes a substrate 12, a transition layer 14, a layer 16, an active layer 18, a layer 20, a layer 22, an electrically conductive element 24, and an electrically conductive element 26.

In an embodiment, the substrate 12 can include, but is not limited to, for example, sapphire (flat or PSS), silicon, silicon carbide (SiC), zinc oxide (ZnO), spinel ($MgAl_2O_4$), gallium nitride (GaN), aluminum nitride (AlN), gallium phosphide (GaP), magnesium oxide (MgO), lithium aluminate ($LiAlO_2$), neodymium gallium oxide ($NdGaO_3$), $ScAlMgO_4$, $Ca_8La_2(PO_4)_6O_2$, or suitable combinations thereof. In an embodiment, the substrate 12 can include sapphire (flat or PSS), silicon, or silicon carbide. In an embodiment, the substrate 12 can include silicon.

The transition layer 14 is formed on the substrate 12. In the illustrated embodiment, the transition layer 14 is disposed at a location between the substrate 12 and the layer 16. The transition layer 14 can, for example, facilitate formation of the first layer 16 on the substrate 12. It will be appreciated that the transition layer 14 can be a single layer structure, or a multilayered structure. For example, in FIGS. 2-3, the transition layer 14 includes a plurality of layers 14A-14B (FIG. 2) and 14A-14C (FIG. 3).

The transition layer 14 can include a composition having an oxygenated IIIA-transition metal nitride. Thus, in an embodiment, the transition layer 14 can alternatively be referred to as the oxygenated IIIA-transition metal nitride layer 14. In an embodiment, a IIIA metal can include, for example, aluminum (Al), gallium (Ga), indium (In), thallium (Tl), or suitable combinations thereof. In an embodiment, a transition metal can include, for example, a IIIB-VB transition metal. Suitable examples of transition metals include, but are not limited to, titanium (Ti), zirconium (Zr), hafnium (Hf), rutherfordium (Rf), or suitable combinations thereof.

In an embodiment, the IIIA metal and the transition metal can include any suitable material based on a particular application. For example, the IIIA metal can include gallium and/or aluminum, and the transition metal can include hafnium or zirconium.

The transition layer 14 can, in an embodiment, improve formation of the layer 16 on the substrate 12. This can, for example, result in fewer manufacturing defects than if the layer 16 is formed directly on the substrate 12 without inclusion of the transition layer 14.

Compared to transition layers that include IIIA nitride, or the like, the oxygenated IIIA-transition metal nitride layer can have improved crystallinity and electrical conductivity properties of GaN grown on the top. In an embodiment, the oxygenated IIIA-transition metal nitride layer can provide a higher quality GaN on the substrate 12 relative to prior transition layers because of the presence of oxygen, which can result in a more gradual transition between the substrate 12 and the transition layer 14.

The layer 16 is formed on the transition layer 14. The active layer 18 is formed on the layer 16. The layer 20 is formed on the active layer 18. Accordingly, the active layer 18 is disposed between the layer 16 and the layer 20. It will be appreciated that one or more additional layers can be included in the optoelectronic device 10. The layer 16, active layer 18, and layer 20 can, in an embodiment, be collectively referred to as the semiconductor 28. In an embodiment, the semiconductor 28 can include semiconductor materials and can, for example, be configured to emit light during operation of the optoelectronic device 10. In an embodiment, the layer 16 can be an n-type layer and the layer 20 can be a p-type layer. In an embodiment, the active layer 18 can alternatively be referred to as an absorptive or absorption layer 20. In such an embodiment, the optoelectronic device may be referred to as a photo detector or the like.

In an embodiment, the layer 16 can be an n-type gallium nitride (n-GaN) layer and the layer 20 can be a p-type gallium nitride (p-GaN) layer. In such an embodiment, the active layer 18 can include semiconductor materials in which electrically excited electrons from the layer 16 combine with holes from the layer 20 to generate photons. The photons can have a specific wavelength for emission of light. In an embodiment, the active layer 18 can include a p-n junction, a double heterojunction, a quantum-well (QW) structure, or a multiple quantum-well (MQW) structure. It will be appreciated that in an embodiment, the active layer 18 may not be included in the optoelectronic device 10. In such an embodiment, the layer 20 is disposed on the layer 16. In another embodiment, the semiconductor 28 can include one or more additional layers. In an embodiment, the active layer 18 can alternatively be referred to as an absorptive or absorption layer 20. In such an embodiment, the optoelectronic device may be referred to as a photo detector or the like.

The layer 22 is formed on the layer 20. The layer 22 can be, for example, a p-contact layer. The layer 22 can be in Ohmic contact with the layer 20. In an embodiment, the layer 22 can be, for example, an indium tin oxide (ITO). In an embodiment, the layer 22 can include a IIIA-transition metal nitride. In an embodiment, the layer 22 can include an oxygenated IIIA-transition metal nitride that is similar to the transition layer 14.

The optoelectronic device 10A also includes electrically conductive elements 24, 26. In the illustrated embodiment, the electrically conductive element 24 is conductively connected to the layer 22. In the illustrated embodiment, the electrically conductive element 26 is conductively connected to the transition layer 14. In an embodiment, the electrically conductive elements 24, 26 may generally be representative of, for example, electrode terminals for electrically connecting a power source to the optoelectronic device 10.

In an embodiment, the electrically conductive element 24 can be a metal or a metallic oxide including, but not limited to, nickel (Ni), gold (Au), an indium tin oxide (ITO), or suitable combinations thereof. In an embodiment, the electrically conductive element 26 can be a metal including, but not limited to, titanium (Ti), aluminum (Al), nickel (Ni), gold (Au), or suitable combinations thereof.

In operation, the layer 16 and the layer 20 can be electrically excited to generate electrons and holes for light generation. In an embodiment, the transition layer 14 can be a multi-crystalline structure.

In FIG. 1B, the optoelectronic device 10B includes the electrically conductive element 26 connected to the substrate 12. Also, as illustrated, the electrically conductive element 24 is formed across an entire surface of the layer 22.

Figure 2:
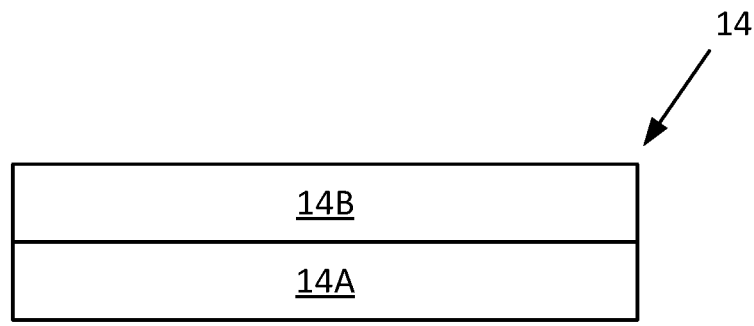
FIG. 2 illustrates a schematic diagram of the transition layer for the optoelectronic devices of FIGS. 1A-1B, according to an embodiment.
Figure 3:
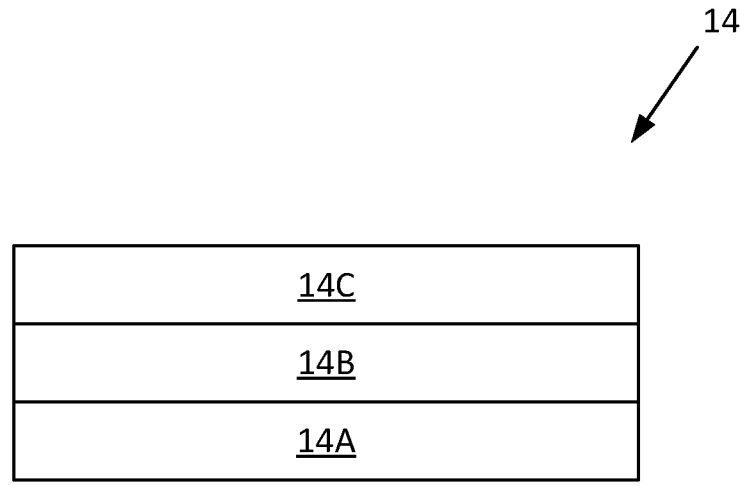
FIG. 3 illustrates a schematic diagram of a transition layer for the optoelectronic devices of FIGS. 1A-1B, according to an embodiment.

FIG. 2 illustrates a schematic diagram of the transition layer 14 in FIGS. 1A-1B, according to an embodiment. In the illustrated embodiment, the transition layer 14 includes two layers 14A, 14B. Aspects of FIG. 2 can be the same as or similar to aspects of FIGS. 1A-1B. For simplicity of this specification, description of features already provided with respect to FIGS. 1A-1B will not be repeated.

In FIG. 2, the first layer 14A of the transition layer 14 would be deposited on the substrate 12 (FIGS. 1A-1B). The second layer 14B of the transition layer 14 is deposited on the first layer 14A. In this configuration, the second layer 14B would be disposed between the first layer 14A and the first layer 16 (FIGS. 1A-1B).

In an embodiment, the first layer 14A and the second layer 14B can have different compositions. In an embodiment, either of the first layer 14A or the second layer 14B can include a plurality of layers.

In an embodiment, the first layer 14A can include $Hf_{x''}Al_{1-x''}N$. In such an embodiment, $x''$ can range from about 0 to about 0.5. The second layer 14B can include $\{Hf_xZr_yAl_zGa_{1-x-y-z}N/Hf_xZr_{y'}Al_zGa_{1-x'-y'-z}N\}n$. In such an embodiment, x, x', y, y', z, and z' can range from about 0 to about 1, x+y+z=1, x'+y'+z'=1, and n is an integral number and can vary from about 1 to about 60. In an embodiment, the second layer 14B can include n sub-layers each including one or more layers of $Hf_xZr_yAl_zGa_{1-x-y-z}N$ and $Hf_xZr_{y'}Al_zGa_{1-x'-y'-z}N$ based on the application. Accordingly, in one embodiment, the transition layer 14 may have a structure of $\{Hf_xZr_yAl_zGa_{1-x-y-z}N/Hf_xZr_{y'}Al_{z'}Ga_{1-x'-y'-z}N\}n/Hf_{x''}Al_{1-x''}N$. In another embodiment, the first layer 14A may include the material of $Hf_{x''}Zr_{y''}Al_{z''}Ga_{1-x''-y''-z''}N$, where x", y" and z" can range from about 0 to about 1, and x"+y"+z"=1. In the foregoing embodiments, one of the first layer 14A or the second layer 14B can additionally include oxygen. In the foregoing embodiments, both of the first layer 14A and the second layer 14B can include oxygen.

FIG. 3 illustrates a schematic diagram of the transition layer 14 in FIGS. 1A-1B, according to another embodiment. In the illustrated embodiment, the transition layer 14 includes three layers 14A, 14B, and 14C. Aspects of FIG. 3 can be the same as or similar to aspects of FIGS. 1A-1B. For simplicity of this specification, description of features already provided with respect to FIGS. 1-2 will not be repeated.

In FIG. 3, the first layer 14A would be deposited on the substrate 12 (FIGS. 1A-1B). The second layer 14B is deposited on the first layer 14A. The third layer 14C is deposited on the second layer 14B. In this configuration, the third layer 14C would be disposed between the first layer 16 (FIGS. 1A-1B) and the second layer 14B. It is to be appreciated that the multilayered transition layers 14 in FIGS. 2-3 are intended as examples. The number of layers in the transition layer 14 can vary, and can be greater than three, according to an embodiment. Further, in an embodiment, the layers 14A-14C of the transition layer 14 can include multiple sub-layers.

In an embodiment, the first layer 14A, the second layer 14B, and the third layer 14C can have different compositions. In an embodiment, one or more of the layers 14A-14C can have a same composition. In an embodiment, one or more of the layers 14A-14C can include a plurality of sub-layers. In an embodiment, including a plurality of sub-layers for one or more of the layers 14A-14C can enable a gradual transition of composition between the layers 14A 14C.

In an embodiment, the transition layer 14 can include the third layer 14C, which can include $Hf_{x'''}Zr_{y'''}Al_{z'''}Ga_{1-x'''-y'''-z'''}N$, where x''', y''', and z''' can range from about 0 to about 1, x'''+y'''+z'''=1. Thus, the transition layer 14 can have a structure of $Hf_{x'''}Zr_{y'''}Al_{z'''}Ga_{1-x'''-y'''-z'''}N/\{Hf_xZr_yAl_zGa_{1-x-y-z}N/Hf_xZr_{y'}Al_zGa_{1-x'-y'-z}N\}n/Hf_{x''}Al_{1-x''}N$, where x" can range from about 0 to about 0.5, and n can range from about 0 to about 60. The third layer 14C, and accordingly, the transition layer 14, can include oxygen.

In an embodiment, the layer 14A can include $\{Hf_xZr_yAl_zGa_{1-x-y-z}N/Hf_xZr_{y'}Al_zGa_{1-x'-y'-z}N\}n$. The second layer 14B can include $Hf_{x''}Al_{1-x''}N$. In an embodiment, the transition layer 14 may not include the third layer 14C (e.g., FIG. 2). As used in this specification, x, x', x", x''', y, y', y", y'''z', z" and z''' mean the content of compositions of Hf, Ga, N, Al, Zr, and can be substituted by other letters or exchanged among them. For example, although as described above, the first layer 14A can include the material of $Hf_{x''}Zr_{y''}Al_{z''}Ga_{1-x''-y''-z''}N$, where x", y" and z" can range from about 0 to about 1, and x"+y"+z"=1. In an embodiment, the first layer 14A can be defined to include $Hf_xZr_{y'}Al_zGa_{1-x'-y'-z}N$, where x', y' and z' can range from about 0 to about 1, and x'+y'+z'=1. In the preceding embodiments, the layers 14A or 14B can include oxygen.

In one embodiment, the transition layer 14 includes $Hf_{1-x}Al_xN$, where x is greater than about 0.83, about 0.9, or is equal to about 0.995. In another embodiment, the transition layer 14 can include $Hf_{1-x}Al_xN$, where x is smaller than about 0.01, about 0.17, or is equal to about 0.05. In an embodiment, each layer of the transition layer 14 can include gradual variations, which means contents of one or more compositions of each layer can be varied gradually. For example, when the transition layer 14 includes the $Hf_{1-x}Al_xN$ layer, x may can from about 0 to about 0.05, or from about 0.05 to about 0. When the transition layer 14 includes the $Hf_{1-x}Al_xN$ layer, x can vary from about 0 to about 0.17, or from about 0.17 to about 0.

As used herein, the HfN/HfAlN structure means the structure includes two layers including an HfN layer and an HfAlN layer. Similarly, $\{Hf_xZr_yAl_zGa_{1-x-y-z}N/Hf_xZr_{y'}$ $Al_zGa_{1-x'-y'-z}N$}n structure can have n layers of a {$Hf_xZr_y$-$Al_zGa_{1-x-y-z}N/Hf_xZr_{y'}Al_zGa_{1-x'-y'-z}N$} structure with can have n layers of a {$Hf_xZr_yAl_zGa_{1-x-y-z}N/Hf_xZr_yAl_zN$} structure with each {$Hf_xZr_yAl_zGa_{1-x-y-z}N/Hf_xZr_{y'}Al_{z'}Ga_{1-x'-y'-z}N$} structure comprising one or two of a layer of $Hf_xZr_yAl_zGa_{1-x-y-z}N$ and a layer of $Hf_xZr_{y'}Al_zGa_{1-x'-y'-z}N$ based on different applications. For example, when n is equal to about 1, the {$Hf_xZr_yAl_zGa_{1-x-y-z}N/Hf_xZr_{y'}Al_zGa_{1-x'-y'-z}N$}n structure includes the one of the layer of $Hf_xZr_yAl_zGa_{1-x-y-z}N$ and the layer of $Hf_xZr_{y'}Al_zGa_{1-x'-y'-z'}N$. When n is equal to about 2, the {$Hf_xZr_yAl_zGa_{1-x-y-z}N/Hf_xZr_{y'}Al_zGa_{1-x'-y'-z}N$}n structure includes two layers of the {$Hf_xZr_yAl_zGa_{1-x-y-z}N/Hf_xZr_{y'}Al_zGa_{1-x'-y'-z}N$} structure with each layer including the structure of {$Hf_xZr_yAl_zGa_{1-x-y-z}N/Hf_xZr_{y'}Al_zGa_{1-x'-y'-z}N$}. Similarly, each of the layers of $Hf_xZr_yAl_zGa_{1-x-y-z}N$ and the layer of $Hf_xZr_{y'}Al_zGa_{1-x'-y'-z}N$ can include gradual compositions. In an embodiment, any of the preceding layers can include oxygen.

Figure 4A:
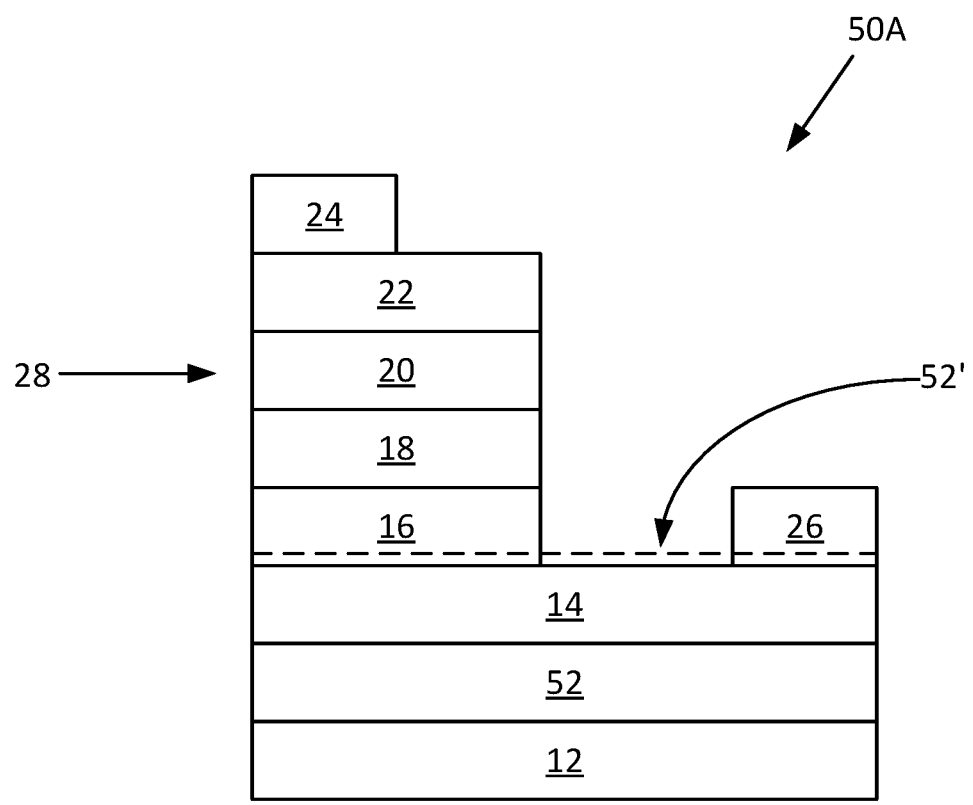
FIGS. 4A-4B illustrate schematic diagrams of an optoelectronic device including a transition layer and a buffer layer, according to an embodiment.
Figure 4B:
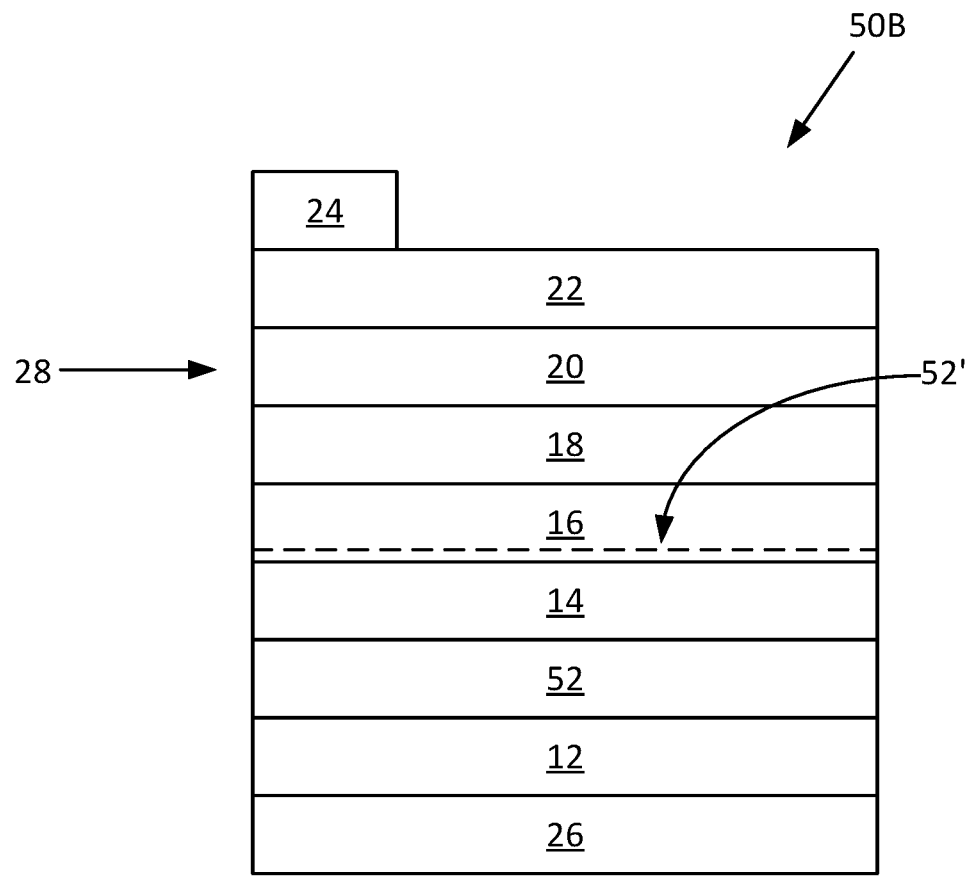

FIGS. 4A-4B illustrate schematic diagrams of optoelectronic devices 50A-50B including the transition layer 14 (FIGS. 1A-3) and a buffer layer 52, according to an embodiment. The optoelectronic devices 50A-50B can be representative of, for example, a light emitting diode (LED), or the like. Aspects of FIGS. 4A-4B may be the same as or similar to aspects of FIGS. 1A-3. For the simplicity of this specification, description of features already provided with respect to FIGS. 1A-3 will not be repeated.

With reference to FIG. 4A, the optoelectronic device 50A includes the buffer layer 52 disposed between the substrate 12 and the transition layer 14. The transition layer 14 can be a single layer or can include multiple sub-layers (e.g., FIGS. 1A-3). It is to be appreciated that the buffer layer 52 is not limited to the location between the substrate 12 and the transition layer 14. In an embodiment, the buffer layer 52 can be disposed on the transition layer 14. In an embodiment, the buffer layer can be disposed between the transition layer and the n-type semiconductor layer. In an embodiment, the optoelectronic device 50A can include a buffer layer 52' disposed on the transition layer 14. In an embodiment, the optoelectronic device 50A can include the buffer layer 52 and the buffer layer 52'. In an embodiment, the optoelectronic device 50A can include the buffer layer 52 or the buffer layer 52'. The buffer layer 52 or 52' can be a single layer or can include multiple sub-layers. In an embodiment, the sub-layers of the buffer layer and the sub-layers of the transition layer are arranged as alternating layers. In an embodiment, the sub-layers of the buffer layer 52 or 52' and the sub-layers of the transition layer 14 are arranged as alternating layers of at least one sub-layer of the buffer layer and at least one sub-layer of the transition layer. In an embodiment, at least one sub-layer of the buffer layer 52 or 52' is disposed between the sub-layers of the transition layer 14. In an embodiment, the sub-layers of the buffer layer 52 or 52' having different compositions from each other. In an embodiment, the sub-layers of the transition layer 14 having different compositions from each other.

In an embodiment, the transition layer 14 can include an oxygenated IIIA-transition metal nitride, and the buffer layer 52 can include a IIIA metal nitride with or without the addition of oxygen. In another embodiment, the transition layer 14 can include a IIIA-transition metal nitride without the addition of oxygen, and the buffer layer 52 can include an oxygenated IIIA metal nitride. In an embodiment, the transition layer 14 can include a IIIA-nitride with or without the addition of oxygen, and the buffer layer 52 can include an oxygenated IIIA metal nitride. In an embodiment, the buffer layer 52 can include a IIIA-nitride with or without the addition of oxygen, and the transition layer 14 can include an oxygenated IIIA-transition metal nitride. In an embodiment, the buffer layer 52 can include an oxygenated IIIA-nitride, and the transition layer 14 can include an oxygenated IIIA metal nitride. In an embodiment, the buffer layer 52 can include an oxygenated IIIA metal nitride. In an embodiment, the transition layer 14 can include an oxygenated IIIA-transition metal nitride. Accordingly, in an embodiment, the buffer layer 52 or the transition layer 14 can include oxygen. That is, in an embodiment, either the buffer layer 52 or the transition layer 14, but not both, can include oxygen. In another embodiment, the buffer layer 52 and the transition layer 14 can both include an oxygen. That is, in an embodiment, both the buffer layer 52 and the transition layer 14 can include oxygen.

It will be appreciated that when the buffer layer 52 does not include an oxygenated IIIA metal nitride, the buffer layer 52 can include a III-V nitride or oxygenated III-V nitride.

In FIG. 4B, the optoelectronic device 50B includes the electrically conductive element 26 connected to the substrate 12. Also, as illustrated, the electrically conductive element 24 is formed across an entire surface of the layer 22.

Figure 5:
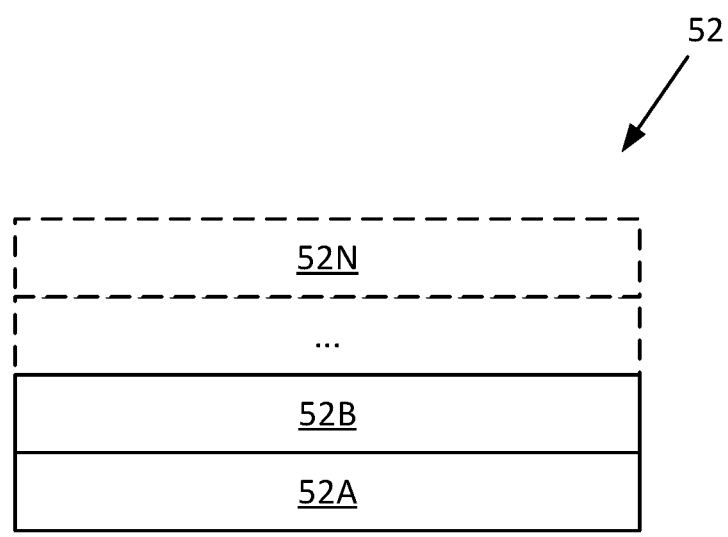
FIG. 5 illustrates a schematic diagram of the buffer layer for the optoelectronic devices of FIGS. 4A-4B, according to an embodiment.

FIG. 5 illustrates a schematic diagram of the buffer layer 52 in FIGS. 4A-4B, according to an embodiment. In the illustrated embodiment, the buffer layer 52 can include the buffer layer 52A, 52B, . . . 52N. That is, in an embodiment, the buffer layer 52 can include two or more layers 52A . . . 52N.

In the illustrated example, the buffer layer 52 includes layers 52A . . . 52N. The buffer layer 52A can be configured to be coupled to the substrate 12 and can include the material/composition of {$Al_xGa_yIn_{1-x-y}N/Al_{x'}Ga_{y'}In_{1-x'-y'}N$}n, where x, x', y and y' can range from about 0 to about 1, x+y=1, x'+y'=1, and n can range from about 0 to about 60. As used in this specification, $Al_xGa_yIn_{1-x-y}N/Al_{x'}Ga_{y'}In_{1-x'-y'}N$}n means the sub-layer 52A can include one or more layers of a layer of $Al_xGa_yIn_{1-x-y}N$ and a layer of $Al_{x'}Ga_{y'}In_{1-x'-y'}N$. The buffer layer 52B is configured to be coupled to the buffer layer 52A and can include the composition of $Al_{x''}Ga_{y''}In_{1-x''-y''}N$, where x'' and y'' can range from about 0 to about 1, x''+y''=1. Either of the layers 52A or 52B, or in an embodiment, both layers 52A-52B, can include oxygen.

Accordingly, the buffer layer 52 can have a structure of $Al_{x''}Ga_{y''}In_{1-x''-y''}N/\{Al_xGa_yIn_{1-x-y}N/Al_{x'}Ga_{y'}In_{1-x'-y'}N\}$n. In an embodiment, the layers 52A-52B can be different from each other. In an embodiment, the material of the layers 52A-52B can be modified. For example, the layer 52A can include $Al_{x''}Ga_{y''}In_{1-x''-y''}N$, and the layer 52B can include {$Al_xGa_yIn_{1-x-y}N/Al_{x'}Ga_{y'}In_{1-x'-y'}N$}n. In an embodiment, the buffer layer 52 may not be included. In an embodiment, the buffer layer 52 can include aluminum nitride (AlN), gallium nitride (GaN) or $Al_xGa_{1-x}N$, where x may range from about 0 to about 1. In the preceding embodiments, the buffer layer 52 can include oxygen.

Figure 6:
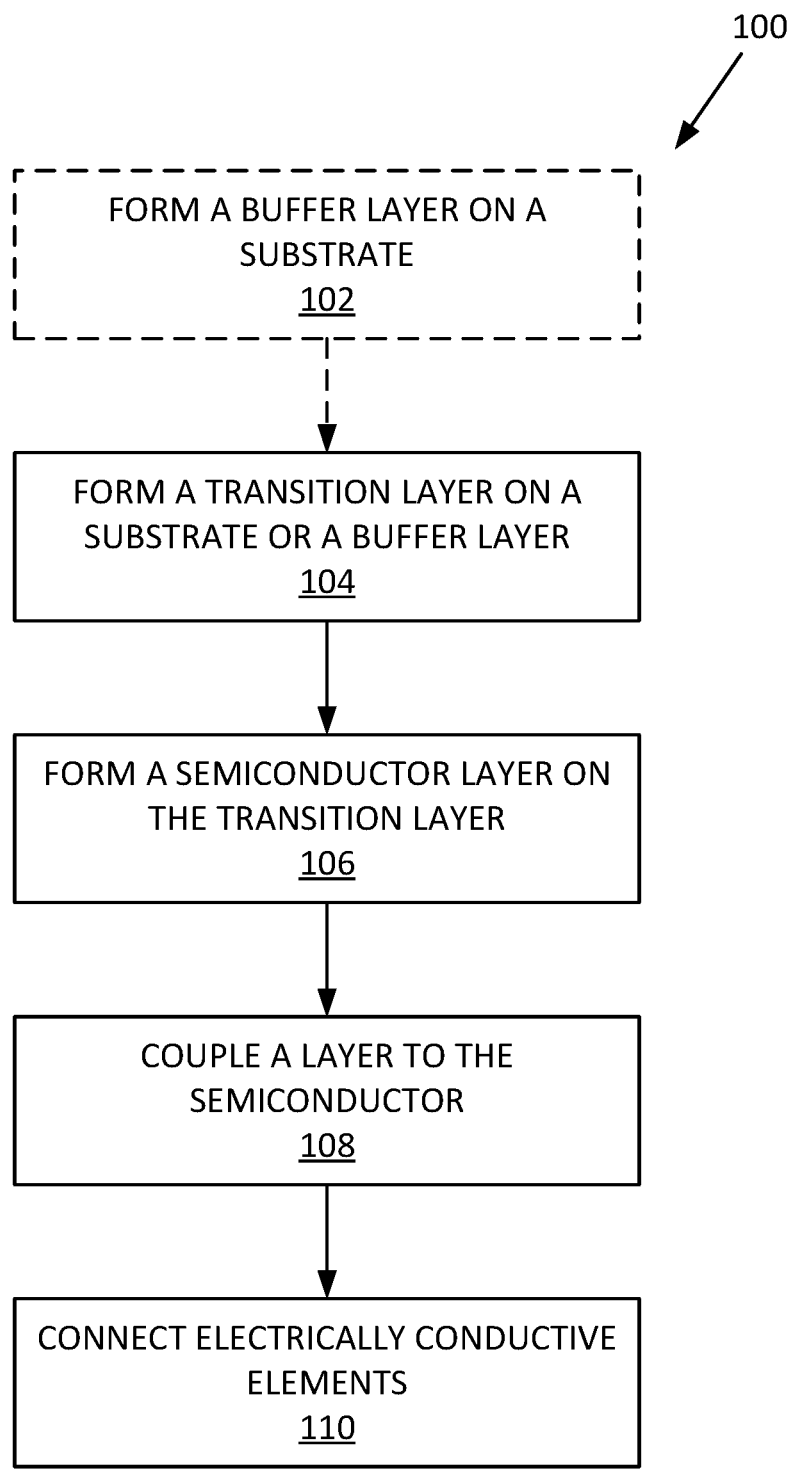
FIG. 6 is a flowchart of a method for forming an optoelectronic device as described in this specification, according to an embodiment.

FIG. 6 is a flowchart of a method 100 for forming an optoelectronic device as described in this specification, according to an embodiment. The method 100 can generally form the optoelectronic devices 10A-10B in FIGS. 1A-1B or the optoelectronic devices 50A-50B in FIGS. 4A-4B.

If the optoelectronic device is to include a buffer layer (e.g., buffer layer 52), the method begins at 102 by forming the buffer layer on a substrate (e.g., substrate 12 in FIGS. 4A-4B). In an embodiment, 102 is optional. A variety of methods may be used to form the buffer layer on the substrate. Suitable methods include, but are not limited to, molecular-beam epitaxy (MBE), metal-organic chemical vapor deposition (MOCVD), chemical vapor deposition (CVD), physical vapor deposition (PVD), hydride vapor phase epitaxy (HYPE), and reactive sputtering. At 104, a transition layer (e.g., transition layer 14 in FIGS. 1A-4B) is formed on the substrate (if 102 was not completed) or on the buffer layer (if 102 was completed). A variety of methods may be used to form the transition layer on either the substrate or the buffer layer. Suitable methods include, but are not limited to, MBE, MOCVD, CVD, PVD, HPVE, and reactive sputtering. At 106 a semiconductor (e.g., semiconductor 28 in FIGS. 1A-4B) is formed on the transition layer. During the formation of the semiconductor, the layers 16-20 (FIGS. 1A-4B) may be formed on the transition layer. A variety of techniques, including the above-identified methods, can be used to form the semiconductor on the transition layer at 106. At 108, a layer (e.g., the layer 22 in FIGS. 1A-4B) is electrically connected to the semiconductor, and at 110, electrically conductive elements (e.g., electrically conductive elements 24, 26) are connected to the layer 22 and the transition layer or the substrate.

The buffer layer 52 can be a single layer or can include multiple sub-layers. The buffer layer 52 can be disposed on the transition layer 14 or between the transition layer 14 and the substrate 12. In an embodiment, the sub-layers of the buffer layer 52 and the sub-layers of the transition layer 14 are arranged as alternating layers. In an embodiment, the sub-layers of the buffer layer 52 and the sub-layers of the transition layer 14 are arranged as alternating layers of at least one sub-layer of the buffer layer 52 and at least one sub-layer of the transition layer 14. In an embodiment, at least one sub-layer of the buffer layer 52 is disposed between the sub-layers of the transition layer 14. In an embodiment, the sub-layers of the buffer layer 52 have different compositions from each other. In an embodiment, the sub-layers of the transition layer 14 have different compositions from each other.

Aspects

It is noted that any of aspects 1-13 below can be combined with any of aspects 14-20.

Aspect 1. An optoelectronic device, comprising:
a substrate;
a semiconductor comprising an n-type layer disposed on the substrate, a p-type layer disposed on the n-type layer, and an active layer disposed between the n-type layer and the p-type layer;
a transition layer disposed on the substrate and located between the n-type layer and the substrate, the transition layer including an oxygenated IIIA-transition metal nitride; and
a p-contact layer disposed on the p-type layer of the semiconductor.

Aspect 2. The optoelectronic device according to aspect 1, wherein the IIIA metal includes aluminum (Al), gallium (Ga), indium (In), thallium (Tl), and combination thereof, and wherein the transition metal comprises titanium (Ti), zirconium (Zr), hafnium (Hf), rutherfordium (Ri), and combination thereof.

Aspect 3. The optoelectronic device according to aspect 2, wherein the IIIA metal comprises one or two of aluminum and gallium, and wherein the transition metal comprises one or two of hafnium and zirconium.

Aspect 4. The optoelectronic device according to any one of aspects 1-3, wherein the transition layer includes a plurality of layers.

Aspect 5. The optoelectronic device according to aspect 4, wherein one or more of the plurality of layers of the transition layer include a plurality of layers.

Aspect 6. The optoelectronic device according to any one of aspects 1-5, further comprising a buffer layer disposed between the transition layer and the substrate.

Aspect 7. The optoelectronic device according to aspect 6, wherein the buffer layer includes a plurality of layers.

Aspect 8. The optoelectronic device according to aspect 7, wherein the buffer layer includes an oxygenated IIIA-transition metal nitride.

Aspect 9. The optoelectronic device according to any one of aspects 1-8, further comprising a buffer layer disposed between the n-type layer and the transition layer.

Aspect 10. The optoelectronic device according to any one of aspects 1-9, further comprising two buffer layers, one disposed between n-type layer and the transition layer, the other one disposed between the transition layer and the substrate.

Aspect 11. The optoelectronic device according to any one of aspects 1-10, further comprising a first electrically conductive element electrically connected to the p-contact layer, and a second electrically conductive element electrically connected to one of the transition layer or the n-type layer.

Aspect 12. The optoelectronic device according to any one of aspects 1-11, wherein the n-type layer includes one of n-GaN and n-$Al_xGa_{1-x}N$, where x is from 0 to 1, the p-type layer includes one of p-GaN layer and p-$Al_xGa_{1-x}N$, where x is from 0 to 1, and the substrate includes one or more of sapphire including flat or patterned sapphire, silicon, or silicon carbide (SiC).

Aspect 13. The optoelectronic device according to aspect 12, wherein the sapphire is one of a flat sapphire substrate or a patterned sapphire substrate.

Aspect 14. A method for making an optoelectronic device, comprising:
forming a transition layer on a substrate, wherein the transition layer includes an oxygenated IIIA-transition metal nitride;
forming an n-type layer on the transition layer;
forming an active layer on the n-type layer;
forming a p-type layer on the active layer, so that the active layer is disposed between the n-type layer and the p-type layer; and
forming a p-contact layer on the p-type layer and an n-contact layer on the transition layer or the n-type layer.

Aspect 15. The method according to aspect 14, further comprising disposing a first electrically conductive element on the p-contact layer, and a second electrically conductive element on the transition layer or the n-type layer.

Aspect 16. The method according to any one of aspects 14-15, wherein a IIIA metal in the oxygenated IIIA-transition metal nitride includes one or two of aluminum and gallium, and wherein the transition metal comprises one or two of hafnium and zirconium.

Aspect 17. The method according to any one of aspects 14-16, further comprising forming a buffer layer between the substrate and the transition layer, the buffer layer including an oxygenated IIIA-transition metal nitride or an oxygenated IIIA-nitride.

Aspect 18. The method according to aspect 17, wherein the buffer layer includes $Al_xGa_{1-x}N$, where x is from 0 to 1.

Aspect 19. The optoelectronic device according to any one of aspects 14-18, further comprising a buffer layer disposed between the n-type layer and the transition layer.

Aspect 20. The optoelectronic device according to any one of aspects 14-19, further comprising two buffer layers, one disposed between n-type layer and the transition layer, the other one disposed between the transition layer and the substrate.

The terminology used in this specification is intended to describe particular embodiments and is not intended to be limiting. The terms "a," "an," and "the" include the plural forms as well, unless clearly indicated otherwise. The terms "comprises" and/or "comprising," when used in this specification, specify the presence of the stated features, integers, steps, operations, elements, and/or components, but do not preclude the presence or addition of one or more other features, integers, steps, operations, elements, and/or components.

With regard to the preceding description, it is to be understood that changes may be made in detail, especially in matters of the construction materials employed and the shape, size, and arrangement of parts without departing from the scope of the present disclosure. This specification and the embodiments described are exemplary only, with the true scope and spirit of the disclosure being indicated by the claims that follow.

What is claimed is:

1. An optoelectronic device, comprising:
   a substrate;
   a semiconductor comprising an n-type layer disposed on the substrate, a p-type layer disposed on the n-type layer, and an active layer disposed between the n-type layer and the p-type layer;
   a buffer layer;
   a transition layer disposed on the substrate and located between the n-type layer and the substrate, the transition layer including a first oxygenated IIIA-transition metal nitride; and
   a p-contact layer disposed on the p-type layer of the semiconductor,
   wherein the transition layer is in a crystalline structure, and
   wherein the buffer layer:
      is disposed between the n-type layer and the transition layer, and wherein the buffer layer:
      is disposed between the transition layer and the substrate, includes a plurality of layers, and includes a second oxygenated IIIA-transition metal nitride.

2. The optoelectronic device according to claim 1, wherein a IIIA metal in the first oxygenated IIIA-transition metal nitride includes aluminum (Al), gallium (Ga), indium (In), thallium (Tl), and combinations thereof, and wherein the transition metal comprises titanium (Ti), zirconium (Zr), hafnium (Hf), rutherfordium (Ri), and combinations thereof.

3. The optoelectronic device according to claim 2, wherein the IIIA metal comprises one or two of aluminum and gallium, and wherein the transition metal comprises one or two of hafnium and zirconium.

4. The optoelectronic device according to claim 1, wherein the transition layer includes a plurality of layers.

5. The optoelectronic device according to claim 4, wherein one or more of the plurality of layers of the transition layer include a plurality of layers.

6. The optoelectronic device according to claim 1, further comprising a first electrically conductive element electrically connected to the p-contact layer, and a second electrically conductive element electrically connected to one of the transition layer or the n-type layer.

7. The optoelectronic device according to claim 1, wherein the n-type layer includes one of n-GaN and n-$Al_xGa_{1-x}N$, where x is from 0 to 1, the p-type layer includes one of p-GaN layer and p-$Al_xGa_{1-x}N$, where x is from 0 to 1, and the substrate includes one or more of sapphire including flat or patterned sapphire, silicon, or silicon carbide (SiC).

8. The optoelectronic device according to claim 7, wherein the sapphire is one of a flat sapphire substrate or a patterned sapphire substrate.

9. An optoelectronic device, comprising:
   a substrate;
   a semiconductor comprising an n-type layer disposed on the substrate, a p-type layer disposed on the n-type layer, and an active layer disposed between the n-type layer and the p-type layer;
   a transition layer disposed on the substrate and located between the n-type layer and the substrate, the transition layer including an oxygenated IIIA-transition metal nitride;
   a p-contact layer disposed on the p-type layer of the semiconductor; and
   two buffer layers, one disposed between n-type layer and the transition layer, the other one disposed between the transition layer and the substrate,
   wherein the transition layer is in a crystalline structure.

10. A method for making an optoelectronic device, comprising:
    forming a first buffer layer;
    forming a transition layer on a substrate, wherein the transition layer includes a first oxygenated IIIA-transition metal nitride;
    forming an n-type layer on the transition layer;
    forming an active layer on the n-type layer;
    forming a p-type layer on the active layer, so that the active layer is disposed between the n-type layer and the p-type layer; and
    forming a p-contact layer on the p-type layer and an n-contact layer on the transition layer or the n-type layer,
    wherein the transition layer is in a crystalline structure,
    wherein forming the first buffer layer includes one of:
       forming the first buffer layer including a second oxygenated IIIA-transition metal nitride or an oxygenated IIIA-nitride and disposing the first buffer layer between the substrate and the transition layer, and
       forming the first buffer layer between the n-type layer and the transition layer.

11. The method according to claim 10, further comprising disposing a first electrically conductive element on the p-contact layer, and a second electrically conductive element on the transition layer or the n-type layer.

12. The method according to claim 10, wherein a IIIA metal in the first oxygenated IIIA-transition metal nitride includes one or two of aluminum and gallium, and wherein the transition metal comprises one or two of hafnium and zirconium.

13. The method according to claim 10, wherein the first buffer layer includes $Al_xGa_{1-x}N$, where x is from 0 to 1.

14. The method according to claim 10, further comprising forming a second buffer layer, wherein the second buffer layer is disposed between n-type layer and the transition layer, and the first buffer layer is disposed between the transition layer and the substrate.

* * * * *